United States Patent [19]

Lagadec et al.

[11] Patent Number: 4,748,578

[45] Date of Patent: May 31, 1988

[54] PROCESS AND APPARATUS FOR TRANSLATING THE SAMPLING RATE OF A SAMPLING SEQUENCE

[75] Inventors: Roger Lagadec, Zurich; Henry O. Kunz, Pfungen, both of Switzerland

[73] Assignee: Willi Studer, Regensdorf, Switzerland

[21] Appl. No.: 674,633

[22] Filed: Nov. 26, 1984

Related U.S. Application Data

[63] Continuation-in-part of Ser. No. 325,043, Nov. 25, 1981, abandoned.

[30] Foreign Application Priority Data

Nov. 26, 1980 [CH] Switzerland ............... 8754/80

[51] Int. Cl.$^4$ ................................. G06F 15/31
[52] U.S. Cl. ................................. 364/724
[58] Field of Search ................. 364/723, 724; 340/347 DD

[56] References Cited

U.S. PATENT DOCUMENTS

| | | | |
|---|---|---|---|
| 3,829,670 | 8/1974 | Kebabian | 364/724 |
| 3,997,773 | 12/1976 | Van Essen et al. | 364/723 |
| 4,020,332 | 4/1977 | Crochiere et al. | 364/724 |
| 4,270,026 | 5/1981 | Shenoi et al. | 364/724 |
| 4,460,890 | 7/1984 | Busby | 340/347 DD |
| 4,472,785 | 9/1984 | Kasuga | 364/724 |
| 4,584,659 | 4/1986 | Stikvoort | 364/724 |
| 4,604,720 | 8/1986 | Stikvoort | 364/724 |

OTHER PUBLICATIONS

Wong et al., "Commutatively & Application of Digital Interpolation Filters & Modulators", *IEEE Trans. on Communications*, vol. com. 28, No. 2, Feb. 1980, pp. 244–249.

Crochiere, "Further Considerations in the Design of Decimators and Interpolators", *IEEE Trans. on Acoustics, Speech and Signal Processing*, vol. Assp-24, No. 4, Aug. 1976, pp. 296–311.

*Primary Examiner*—David H. Malzahn
*Attorney, Agent, or Firm*—Helfgott & Karas

[57] ABSTRACT

An input sampling sequence with an input sampling rate is translated into an output sampling sequence with a selectable output sampling rate in a sampling filter. A circuit for forming the time difference of the sampling points forms from the given input sampling rate and the desired output sampling rate a signal corresponding to the time difference and this is used in a translation circuit for converting into data for characterizing the filter coefficients. The sampling filter is conditioned by the selected coefficients from the translation circuit. The invention is suitable for the transmission of sampled data, particularly sampled rates between two systems operating at different clock frequencies.

8 Claims, 8 Drawing Sheets

PROCESS AND APPARATUS FOR TRANSLATING THE SAMPLING RATE OF A SAMPLING SEQUENCE

REFERENCE TO RELATED APPLICATION

This application is a continuation-in-part of co-pending application Ser. No. 325,043, filed Nov. 25, 1981, now abandoned bearing the same title and by the same inventors as the present application, the entire disclosure of which is hereby incorporated by reference.

FIELD OF THE INVENTION

The present invention is in the field of signal processing and relates to a process for translating an input sampling sequence with an input sampling rate into an output sampling sequence with a selectable, arbitrary output sampling rate in such a way that the two sampling sequences have rate spectra, which are of identical amplitude in a rate extending from a zero rate to half the lower of the two sampling rates, except for an error portion limited only by the precision of processing the sampling values. The invention also relates to a circuit arrangement for performing the process.

BACKGROUND OF THE INVENTION

Hitherto, two fundamentally different processes are known for translating the sampling rate of a sampled signal.

The first process consists of converting the sampled quantized signal into a continuous signal. An analog low-pass filter suppresses the high frequency portions of the input signal. The continuous signal brought about by the conversion is then sampled again at the desired output-side sampling rate. Band limitations which may be necessary for preventing aliasing is obtained by a corresponding dimensioning of the low-pass filter. In working with sampled signals in digital form, this process required the use of a digital-analog converter and an analog-digital converter, which involves high costs.

This process for translating the sampling rate is nowhere explicitly described in the literature but can be attributed to the prior art.

In the case of sampled signals, there is fundamentally a second process for translating the sampling rate, but only if there is a fixed relationship between the input and output sampling rates. If the relationship between the two sampling rates is represented as the relationship between two integers, then the two sampling rates have joint integral multiple rates. The sampling rate is translated by increasing the input sampling rate to one of the joint integral multiple rates and by subsequent reduction to the output sampling rate, both in an integral ratio. To increase the sampling rate by a factor N, initially in each case (N-1) equidistant, zero-value sampling values are introduced between two succeeding sampling values of the input sampling sequence. The resulting signal has the same spectrum as the original signal, but a correspondingly increased sampling rate.

For the further processing of the signal, the higher partial spectrum between the half of the original sampling rate and the half of the new, higher sampling rate must be suppressed, which is carried out with a low-pass sampling filter. By undersampling the new sampling sequence with the output sampling rate, the spectrum is aliased. A band limitation which may be required for preventing aliasing can be achieved by corresponding dimensioning of the low-pass sampling filter.

The significance of this is related to a sampling therorem generally known in the art. This theorem holds that an audio signal of, e.g., 20 kHz bandwidth has to be sampled at least 40,000 times per second, or the original signal will not be recovertable from the samples. Technically, the sampling theorem has one important consequence. If signals are still present anywhere beyond half the sampling frequency, sampling will modulate them back into the signal band, a phenomenon described as "aliasing". Therefore, the analog input signal has to be cleaned from any signal with a frequency higher than half the sampling frequency.

If transverse filters are used for low-pass filtering, a considerable part of the processing expenditure can be avoided by not carrying out those multiplications of signal variables with filter coefficients in which the variables have a zero value and there is no need to determine the intermediate values of the sampling sequence with the higher sampling rate, which are not required due to the undersampling.

The sampling rates at the input and output determine the smallest possible integral multiple rate, as well as the coefficients of the sampling filter, which must therefore be redimensioned for every new relationship or ratio of the two sampling rates. This type of sampling rate translation is described, e.g., in Schaefer & Rabiner, *A Digital Signal Processing Approach to Interpolation,* Proc. IEEE, pp. 692–702, Vol. 61, No. 6, June 1973.

A disadvantage of the latter process is that when simple relationships between the input and output sampling rates do not exist, the smallest joint integral multiple rate will be very high. This requires a correspondingly high filter order, because the relative steepness of the amplitude response of the low-pass sampling filter consequently increases.

An increase or decrease in the sampling rate can also take place in a number of stages. It is advantageous in this connection that the individual filter orders can be made lower.

BRIEF DESCRIPTION OF THE INVENTION

An object of the present invention is to provide a process for translating the sampling rate which, on the one hand, has the flexibility of use resulting from the process of restoring into a continuous (analog) signal and resampling, without having the disadvantages resulting from the conversion of the sampled signals into continuous signals and vice versa.

A further object of the invention is to provide a process in which a single set of filters permits the translation of the sampling rate for a wide range of uses and consequently avoids recalculation or changing of filters as a function of the input and output sampling rates used.

Another object of the invention is to provide a process according to which, with the same circuitry, an input signal with a given sampling rate can be translated into an output signal with a selectable sampling rate, the two signals having the same spectral content up to a rate corresponding to half the lower of the two sampling rates.

It is a further object of the invention to provide a circuit arrangement permitting the performance of the aforementioned process for translating the sampling rate.

Another object of the invention is to provide a circuit arrangement which recognizes and makes optimum use of the multiplicity of existing integrated circuit components.

Briefly described, the invention includes a process for translating an input sampling sequence with an input sampling rate into an output sampling sequence with a selectable output sampling rate so that the two sampling sequences have rate spectra which are of identical amplitude in a rate range extending from zero rate to about half the lower of the two sampling rates except for an error portion determined only by the precision of processing the sampled values, comprising determining the instantaneous time difference between the input and output sampling times and producing a control signal representative of that difference, translating the sampling rate, and controlling the sampling rate translation as a function of the characteristics of the control signal.

In another aspect, the invention includes an apparatus for translating an input sampling sequence with an input sampling rate into an output sampling sequence with a selectable output sampling rate so that the two sampling sequences have rate spectra which are of identical amplitude in a rate range extending from zero rate to about half the lower of the two sampling rates except for an error portion determined only by the precision of processing the sampled values, comprising the combination of circuit means for determining the instantaneous time difference between the input and output sampling times and for producing signals representative of that difference, translation circuit means for converting said signals representative of time difference into data representative of a set of filter coefficients, and sampling filter circuit means for converting the input sampling sequence at the input sampling rate into an output sampling sequence at the output rate in response to said filter coefficients.

In order that the manner in which the foregoing and other objects are attained in accordance with the invention can be understood in detail, particularly advantageous embodiments thereof will be described with reference to the accompanying drawings, which form a part of this specification and wherein:

Before going into detail, a brief illustrative description will be given. According to the presently proposed process, the input sampling sequence, then a translation sampling sequence with a very high translation sampling rate and finally the output sampling sequence are considered.

If the output sampling signal is finally defined at times which do not fit into the raster of the translation sampling signal, it is possible to use the translation signal by using, on the time axis, adjacent points in place of the missing points, but in so doing there is the problem of jittering of the sampling time or, linked therewith, jittering of the output sampling sequence. The higher the translation sampling rates, the lower the sampling jitter errors.

It is possible to calculate how high the translation sampling rate must be for a given jitter error. Due to this translation sampling rate, there is a corresponding sampling filter for increasing or decreasing the sampling rate.

The frequency response of this filter for translating the sampling rates can be calculated and therefore so can the corresponding spectrum following processing with the filter.

Provided that transverse filters are used, each point in the translation sampling sequence is calculated as a scalar product of the coefficient vector of the filter with the momentarily required vector of the input variables. When using a sampling filter for increasing the sampling rate, many components of that vector have a zero value.

Such a scalar product must be calculated for each calculation of an output point. The precise position of the output sampling point determines the position of the point to be calculated in the raster of the translation sampling sequence and, consequently, also those coefficients which are not associated with zero-value components of the input variable vector. It can also be said that the determination of the position of the output sampling point will have the precision of the raster of the translation sampling sequence and exactly defines the point to be calculated, the non-zero-value input sampling values required for this and the associated coefficients of the filter.

The relative position of the output sampling point relative to the input sampling point is therefore the key information for controlling the processing on increasing the sampling rate. An equivalent information is the relative position of the input sampling point relative to the output sampling point on reducing the sampling rate.

Naturally, the relationship between the relative position of the sampling points on the one hand and the filter coefficients on the other is simpler if the filter length and the ratio when increasing or decreasing the sampling rate are in a simple relationship to one another.

The construction of the filter can obviously be greatly simplified by a multistage design thereof. For example, the sampling rates can be successively increased with the aid of sampling filters until the very high translation sampling rate is obtained. Another method consists of producing the signal with the translation sampling rate and successively reducing the sampling rate by filtering. The two represented processes are symmetrical in principle. In both cases, working takes place with a relative time difference of the sampling times.

On working with random relationships of the sampling rates, it may occur that the band limitation of the signals is not adequate. In this case, it is advantageous to carry out a band limitation prior to translating the sampling rates or to carry it out after translating the sampling rate. In this case, the process is extended by additional prefiltering and postfiltering.

The increase in the sampling rate with the aid of a sampling filter is brought about in a manner which is, per se, known by first introducing zero sampling values between the original sampling values and then by processing the resulting new sampling sequence with a filter at the higher sampling rate. In the case of a multistage increase in the sampling rate, this process is repeated a number of times. The insertion of the zero sampling values is strictly cyclic and the multiplication of a zero-value variable with a coefficient as part of the calculation of a filter output value (in the sense of the aforementioned scalar products) can be omitted. This applies both in the case of single-stage and multistage filters.

A further simplification, particularly for control and conversion purposes, is obtained by choosing powers of two for the factors for increasing or decreasing the sampling rates, as well as for the filter lengths.

The replacement of one point of a continuous function by the next point of a cyclic raster corresponds to the processing of the continuous signal by a sampling and holding circuit. The same applies regarding the replacement of one point of a sampled function by the next point of a cyclic raster, which corresponds to undersampling.

In this case, the sampling and holding circuit must be understood in the sense of a sampled system, and not a continuous system. The transfer function of the continuous system, as well as the time-discrete sampling and holding circuit is known. In the continuous case, the transmission function in the Laplace range is e.g.:

$$H(p) = \frac{1 - \exp(-pT)}{p}$$

where p is the Laplace-operator, and T is the sampling cycle.

In the case of a discrete sampling and holding circuit, linked with a recution of the sampling rate by the factor n, the corresponding formula in the z-range is:

$$H(z) = \frac{1 - z^N}{1 - z}$$

If assumptions are made regarding the spectral distribution of the input signals, as well as regarding the already performed increase in the sampling rate, the two aforementioned formulas give a measure of the expected error in a given translation sampling rate.

The amplitude response of these transfer functions in the sampling range is particularly interesting in connection with the understanding of the process. It is clear that these transfer functions permit the passage of the first partial spectrum of the sampled signals, but to a certain extent suppress the higher partial spectra. If the sampling holding elements are replaced by conventional elements, i.e., zero order by higher order, this suppression of the higher partial spectra is more pronounced.

It is obvious to use as the first or last filter a sampling holding member of a first or second or third, etc. order. A sampling and holding member of the first order exactly corresponds to a linear interpolator between two adjacent sampling values. A sampling and holding member of the second order corresponds to a quadratic interpolation and a sampling and holding member of the third order to a cubic interpolation. The transfer functions of these filters can be gathered from the above formulas by adding a corresponding power.

When processing sampling signals with such filters, an important advantage appears. Namely, these filters have coefficients which can be exactly represented with a finite word length. Thus, there is no need to quantize the coefficients of these filters and the transfer functions can be exactly given.

The process can be extended to the simpler case with fixed ratios of the sampling rates, in that the output sampling rate is not exactly read off and is instead internally produced. The other processing steps remain unchanged.

In this process, as in the process with converters and an analog filter, there is a danger of jittering of the timing signals, which can lead to noise interference with the sampled signals. The process can be refined by performing the time difference only after suppressing the short-term jitter, e.g., with the aid of a PLL circuit.

Another process for increasing the resolution and precision comprises carrying out averaging after quantizing the time points and for or during the determination of the time difference and this also suppresses short-term fluctuations.

Figure 1:
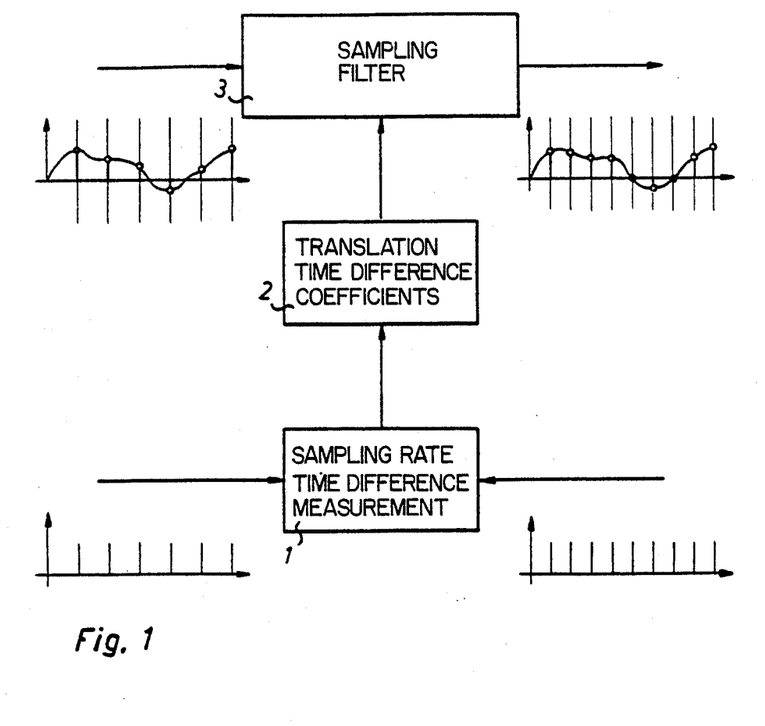
FIG. 1 is a schematic circuit diagram, showing a circuit in accordance with the invention, in block diagram form, for performing the process.

FIG. 1 shows in block form the essential functional components and, specifically, a sampling filter 3 with an input for an input sampling sequence, a second input for the control signals or the data signals of the sampling filter, as well as an output for the output sampling sequence. To assure clear representation, the input and output sampling sequences are shown in conjunction with the transmitted signal, in each case with different sampling rates. In this example, the sampling rate is increased, so that the signal retains unchanged its spectral information. A further functional component 1 is used for measuring the time difference between the two sampling rates. These are also graphically shown on the input side. On the output of this component, the time difference information is passed to a component 2 in which the measured time difference values are translated into corresponding filter coefficients, which are used for the conditioning of the sampling filter 3.

Figure 2:
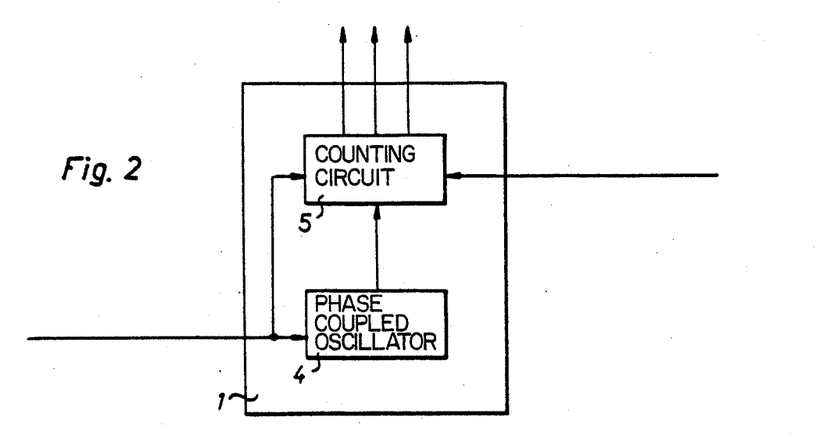
FIG. 2 is a schematic block circuit diagram showing a circuit usable in FIG. 1 for measuring the time difference between the input sampling time and an externally predetermined output sampling time.

FIG. 2 is a detailed view of functional component 1 for measuring the time difference between the input and output sides sampling times. The input sampling rate is passed to a phase-coupled oscillator 4, whose output frequency corresponds to the translation sampling frequency. Circuits of this type are known in the art as PLL (Phase-Locked Loops) and permit a precise and phase-locked increase of the frequency of a precise signal. The output frequency of the phase-coupled oscillator is supplied to the connected digital counter 5, where it is used as a counting clock. The input sampling rate is additionally supplied to the counter, as is the output sampling rate. The counting process is initiated by the appearance of one side of the signal with the input sampling rate, whilst the next side of the signal with the output sampling rate interrupts the counting process and indicates that the counter reading can be read off. As this time interval measuring arrangement can be constructed in many different forms, a general representation of the counterstage has deliberately been provided here. The parallel data word at the counter input, following a counting process, contains a measure for the sought time difference with a time quantization which is the same as the reciprocal translation rate.

Figure 5:
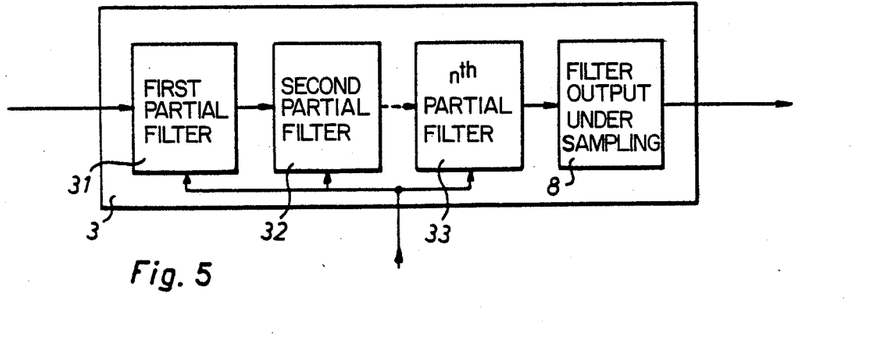
FIG. 5 is a block diagram showing in more detail the sampling filter of FIG. 1 with undersampling at the output.

FIG. 5 shows the construction of sampling filter 3. Cascade-connected partial filters 31, 32 and 33 are simultaneously and in parallel provided with the filter coefficient information by translation circuit 2. The interrupted connection shown between partial filters 32 and 33 indicates that a multistage arrangement up to the nth partial filter is provided. A circuit 8 which samples the complete filter input performs the present undersampling operation.

The circuit described hereinbefore is intended to provide an example for the translation of sampled audio signals. The input sampling rate is approximately 50 kHz and the output sampling rate between 44 and 50 kHz. A precision corresponding to a word length of 16 bits is sought. Calculations show that the translation rate must be higher by a factor of $2^{15}=32,768$ than the input sampling rate.

The sampling filter 3 is constructed as a four-stage filter, which successively increases the sampling rate. The first two stages are controlled in a locked sequence, while the last two stages are controlled by the time difference of the sampling points, i.e., only the last two filters receive signals from the translation stage 2.

The first sampling filter increases the sampling rate, e.g., by a factor of 2 and is constructed as a low-pass filter in such a way that it permits the passage of the first partial spectrum and suppresses the second partial spectrum. For example, the filter has a pass band of up to 20 kHz and an attenuation band of 30 to 50 kHz in the case of a sampling rate of 100 kHz.

The second filter increases the sampling rate in this case by, e.g., a further factor of 4 and consequently reaches the intermediate output sampling rate of 400 kHz. Its pass band is also 0 to 20 kHz, whilst its attenuation band extends from 80 to 200 kHz, the latter advantageously having two attenuation zones.

Both filters are designed as transverse filters. Available synthetic programs make it possible to calculate the filter coefficients for given filter tolerances. The associated filter orders are in each case less than 100 and the filters can be constructed without difficulty using existing technology.

The third filter is a cubic interpolation filter, which increases the sampling rate by a factor of 16. For determining the coefficients of this filter, it is possible to use a linear interpolation filter with the same increase of the sampling rate. The coefficients of the linear interpolation filter have a linear progression wherein the first coefficient is 0, the second 1/16, the third 2/16, etc. The 17th coefficient is 1 or 16/16, the 18th decreased again and is 15/16, whilst the 19th is 14/16, etc. The last coefficient is the 32nd and amounts to 1/16. In order to now determine the coefficients of the cubic interpolation filter, it is merely necessary to calculate the coefficients of the filter resulting from the cascade of two such linear interpolation filters. The individual coefficients can be obtained by formula means by discrete aliasing of the unit pulse response of the linear interpolation filter, which exactly correspond to the cascade of the two linear interpolation filters.

The final filter is designed as a linear interpolation filter with an increase of the sampling interpolation filter with an increase of the sampling rate by e.g., a factor of 256. Therefore, the filter has a length of 512 and its coefficients can be precisely represented with 8 bits and a constant sign bit.

The transfer function in the z-range of a linear interpolation filter with an n-times increase of the sampling rate is:

$$H_{n,1}(z) = \left( \frac{1 - z^n}{1 - z} \right)^2$$

With a quadratic interpolation filter, the transfer function for the same increase of the sampling rate is:

$$H_{n,2}(z) = \left( \frac{1 - z^n}{1 - z} \right)^3$$

In the case of a cubic interpolation filter, it is:

$$H_{n,3}(z) = \left( \frac{1 - z^n}{1 - z} \right)^4 = (H_{n,1}(z))^2$$

In the case of higher order interpolation filters, the formula is similar and only the exponent must be correspondingly chosen.

The control of the first two filters can take place independently of the output sampling rate. An input time signal generator generates all the necessary auxiliary signals from the input sampling rate. Processes for realizing and controlling digital filters, as used in the first two stages, are known from the literature and can be incorporated from there, (cf Rabiner and Gold, Theory and Applications of Digital Signal Processing, Prentice-Hall, USA).

Figure 12:
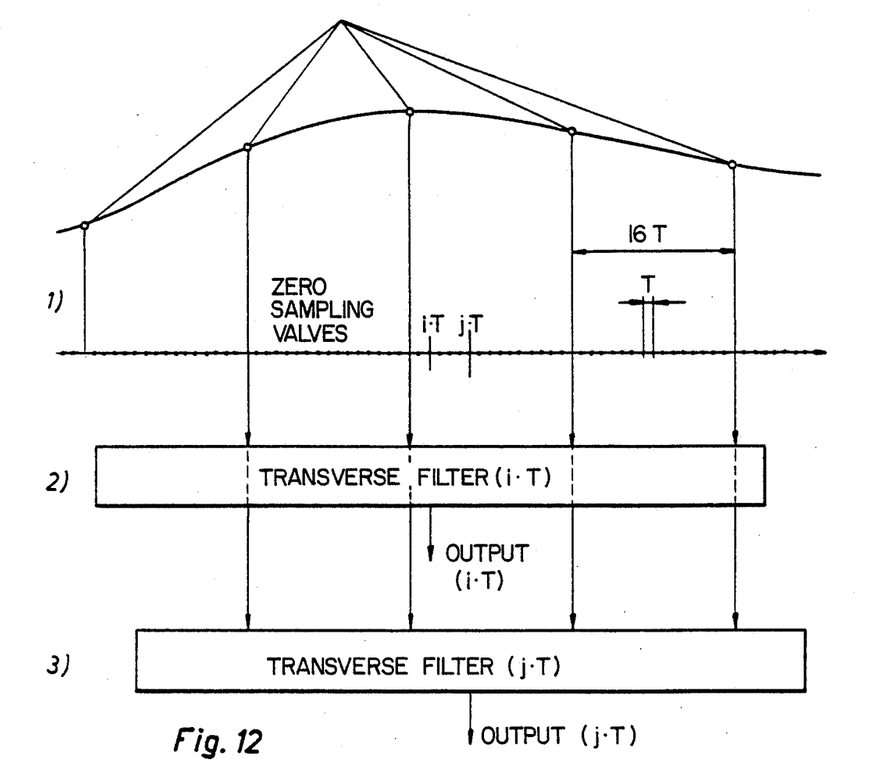
FIGS. 12 and 12a are diagrams illustrating the processing stages during translation.

The control of the third and fourth filters occurs differently from the control of the first and second filters. FIG. 12 shows the relative positions, in the time domain, of the input sampling values combined with zero sampling values (1) on the one hand and of the same set of fixed filter coefficients of the filter (2) and (3) on the other hand. This figure refers to the operation of the third filter when calculating two different output values corresponding to two different times iT and jT. In both cases the boxes labelled "transverse filter" contain the same set of coefficients and are centered at the position iT or jT corresponding to the moment of observation. This is illustrated by the position of the arrow referred to as "output" and representing notionally the "center" of the filter, as often used in the literature of the art.

Each input sampling value corresponds uniquely to one given coefficient for every possible moment in time iT or jT as illustrated by the vertical arrows (in FIG. 12) coming down from the input sampling values and pointing to coefficients in the third filter in its two time positions iT(2) and jT(3). Thus, knowledge of the fixed sets of coefficients of the transverse filter, which fixed set can be derived by conventional methods from the chosen specifications relating to fixed ratio change in sampling rate, and knowledge of the relative positions in time of both input samples and the desired output sample, define uniquely which filter-coefficients must be multiplied with which input sample values in order to yield the desired output. The position of the desired output value in a discrete time raster defines the subset of filter coefficients to be used in computation, while the remaining coefficients need not be used, as they correspond to zero input sampling values. In other words, the relative time difference quantized to the discrete time grid corresponding to the translating frequency of the third filter defines the set of coefficients to be used in computation, and thus, can be used as a control quantity in addressing the said set of coefficients. It is therefore possible to control a filter with fixed coefficients on the basis of a computed time difference, and to perform sampling frequency conversion even though the ratio of input to output sampling frequencies was not known beforehand.

The same principle applies for the fourth filter stage, the measurement of the relative time difference taking place with the translation sampling rate of the final filter stage.

As we are working with an example of power of two ratios of the sampling rate and filter lengths, it is also possible to combine the two necessary measurements of the relative time differences. For each new side of the sampling rate, a digital counter is set to zero after the second filter and counts a counting clock with the highest translation rate (it is, in the example, 32,768 times the input sampling rate). As for each new side, the counter is set at zero, the maximum counter reading is 4095 i.e., $2^{12}-1$. When an output sampling pulse appears, the counter is stopped and is read off. The counter content is a 12-bit number whose four higher value bits contain the information for controlling the third filter and whose eight lower value bits contain the information for controlling the fourth filter.

The precise control process of the third and fourth filter, i.e., the transition from the relative time difference to a specific calculating sequence in the filter is very closely linked with the filter construction details and is consequently omitted here. The definition of the filter, the definition of the coefficient sets to be used and details from the technical literature (e.g., the previously cited book by Rabiner and Gold) make it possible to construct without difficulty the filters described here.

Figure 3:
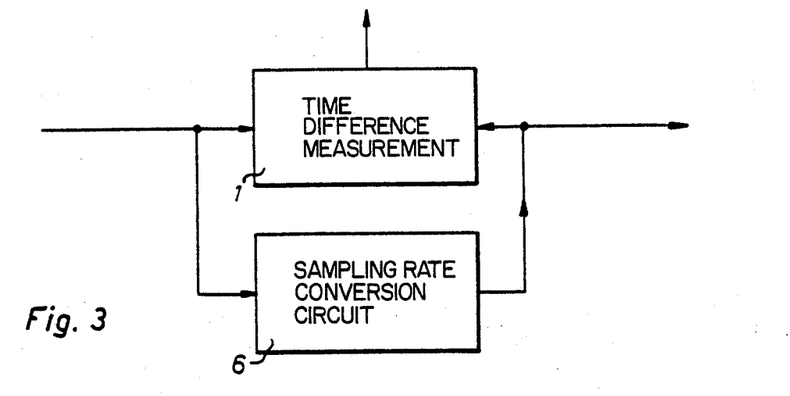
FIG. 3 is a schematic block circuit diagram showing a circuit usable in FIG. 1 for measuring the time difference between the input sampling time and the internally converted output sampling time.
Figure 4:
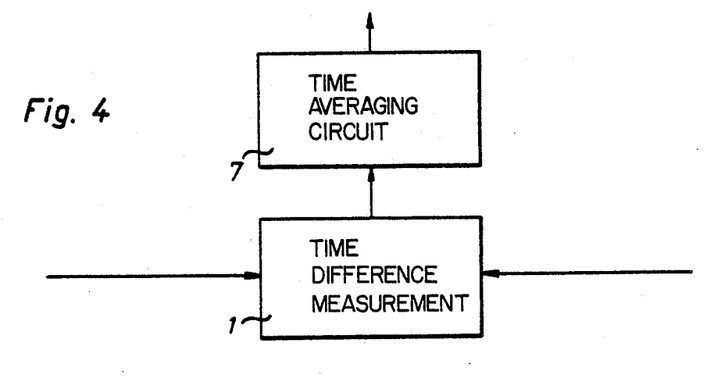
FIG. 4 is a schematic block diagram showing a circuit usable in FIG. 1 for measuring the time difference, supplemented by a time averaging device.

FIGS. 3 and 4 show further possibilities for the formation of the information from the relative time differences of the two sampling signals for the translation into values in the same way as filter coefficients. Thus, in FIG. 4, the time difference values obtained in continuous sequence are time-averaged in time-averaging circuit 7. This averaging makes it possible to define a value with increased resolution from various measurements of the position of the same time with reduced resolution. Thus, the maximum processing speed within the counter circuit is reduced. The time-averaging of individual time differences to give a more accurate result is also carried out with the aid of a calculating circuit of the type presently used in digital filter technology.

According to FIG. 3, the output timing signal or the output sampling rate can be directly derived from the input sampling rate. To this end, the latter is converted in a sampling rate conversion circuit 6 and is supplied to the time difference measuring circuit 1 whilst at the same time being further utilized as a timing signal. Thus, it is also possible to use the same arrangement for translating the sampling rate in cases where in the output sampling rate is directly derived from the input sampling rate, instead of being externally supplied as hitherto.

Figure 6:
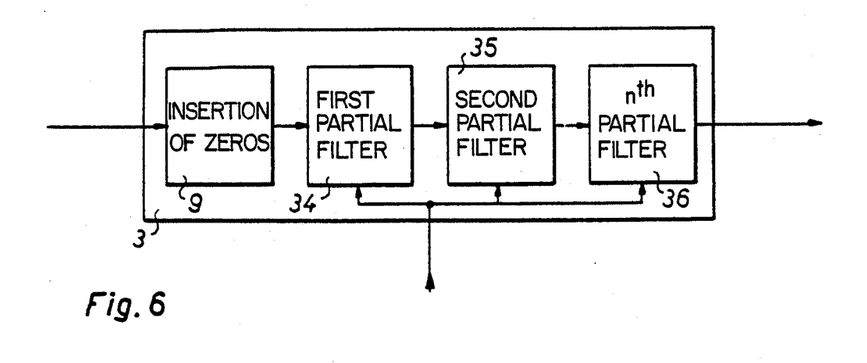
FIG. 6 is a block diagram showing in more detail the sampling filter of FIG. 1 with the insertion of zero sampling values for increasing the sampling rate at the input.

FIG. 6 shows a circuit arrangement of sampling filter 3 in which with the aid of circuit 9, the input sampling rate is artificially increased by inserting zero sampling values between the input sampling values. The now higher frequency input sampling sequence is reduced to the desired output sampling rate by means of a multi-stage cascade of partial filters 34, 35, 36 to which are supplied, in parallel from the translation stage, the filter coefficients which are dependent on the momentary time difference.

Figure 7:
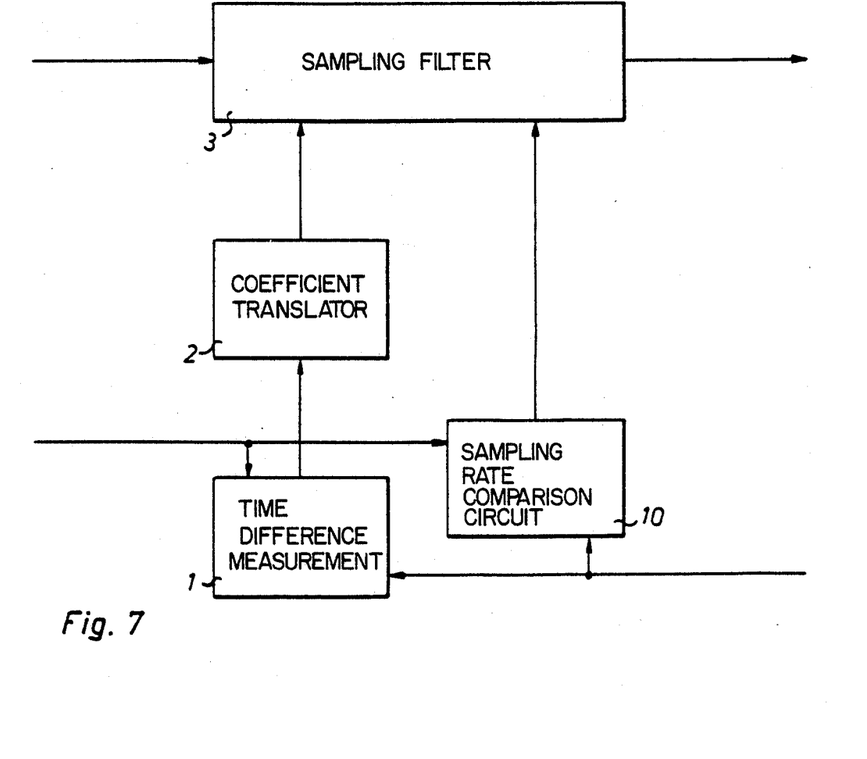
FIG. 7 is a block circuit diagram according to which the sampling filter is changed in its configuration as a function of the sampling rate ratio.

FIG. 7 shows a circuit arrangement making it possible, as required, to carry out the additional quantization by inserting additional zero sampling values between the sampling values given by the input sampling sequence (according to FIG. 6) or the undersampling of a maximum translation sampling rate increased by means of an n-stage filter cascade, as shown in FIG. 5. Once again, from the time difference measuring circuit 1, the relevant filter coefficients are associated with a value dependent on $\Delta t$ as a function of the input and output sampling rate in the coefficient translator 2. The selected filter coefficient or their values are then used for conditioning the filter cascade in sampling filter 3. A sampling rate comparison circuit 10 controls circuit 8 in sampling filter 3 responsible for undersampling in such a way that the sampling sequence having the relatively high inner translation sampling rate is only read off at the output side sampling times.

The coefficient translator 2 is a simple look-up table implemented, for example, by read-only memories or by simple logic circuitry. The inputs to the coefficient translator are both the relative time difference and an instantaneous, fixed-sequence filter coefficient address. The output is a corrected, instantaneous filter coefficient address.

Within the filter 3 itself, as is common in state of the art digital filtering, a read only memory, containing all the filter coefficients and fed by an address, allows access to one single coefficient on the basis of one single address. The coefficient translator 2 can be considered as an address offset circuit, shifting a fixed sequence of filter coefficient addresses by an offset represented by the appropriately scaled relative time difference in order to yield the desired sequence of filter coefficient address.

Figure 8:
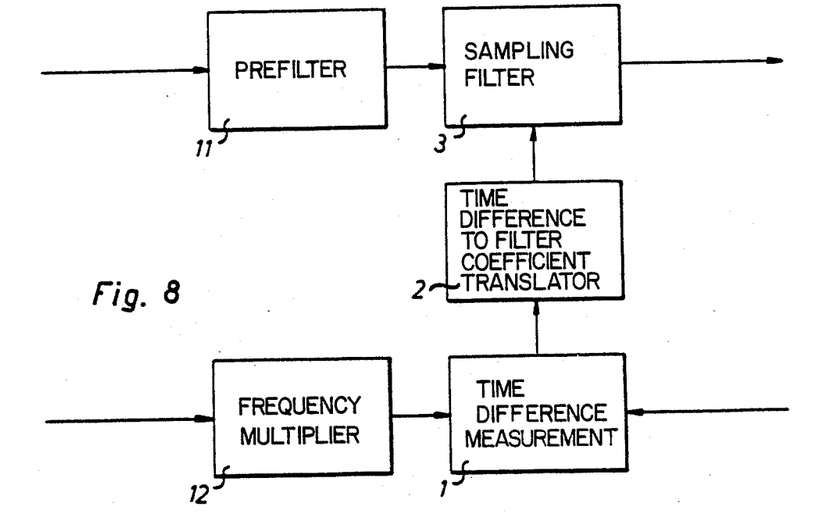
FIG. 8 is a block diagram showing a modified circuit arrangement according to FIG. 1 using a prefilter.
Figure 9:
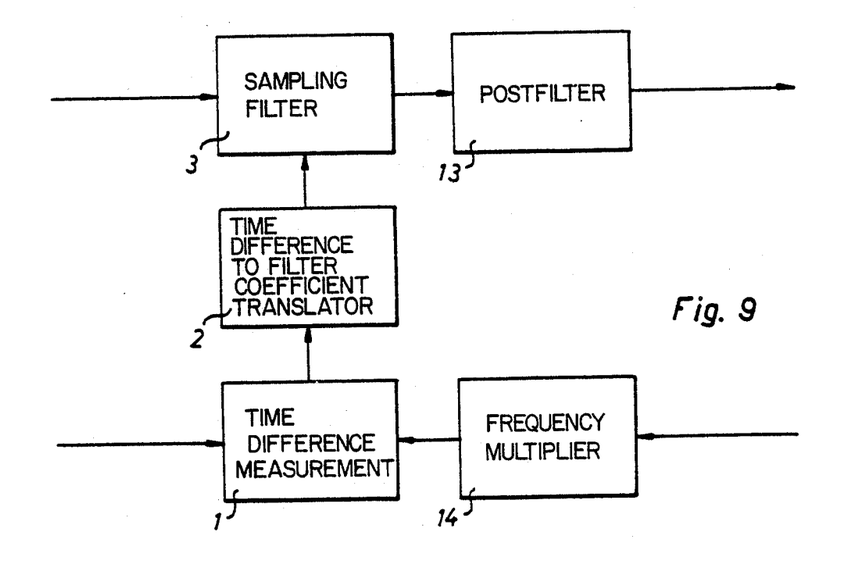
FIG. 9 is a schematic block diagram showing a further modification of the circuit arrangement according to FIG. 1 using a postfilter.
Figure 10:
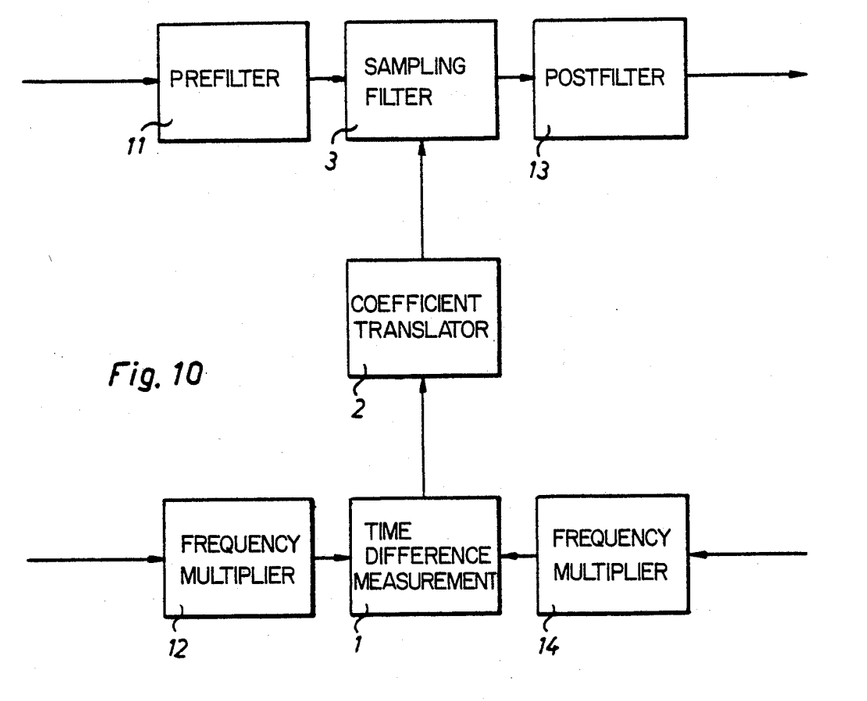
FIG. 10 is a schematic block diagram showing combining the circuitry of FIGS. 8 and 9 to perform the process.
Figure 11:
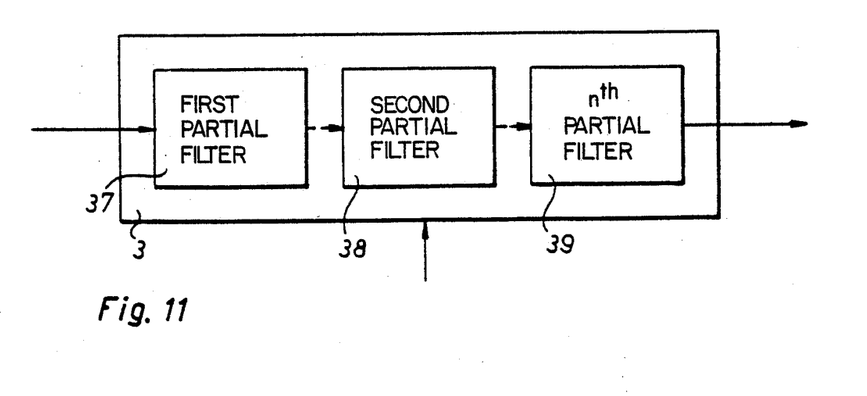
FIG. 11 is a schematic block diagram showing a further partial circuit of the sampling filter of FIG. 1.

The circuit arrangement for translating the sampling rate of an input sampling sequence is made more flexible with the connecting in of a prefilter 11 together with a frequency multiplier 12 for the input sampling rate according to FIG. 8 or a postfilter 13 together with a frequency multiplier for the output sampling rate according to FIG. 9, or both measures simultaneously as shown in FIG. 10.

Prior to introducing the input sampling sequence into the sampling filter 3, for matching purposes it undergoes a frequency increase by a fixed ratio in a prefilter 11 and is then reduced by the same ratio in a postfilter 13. The same frequency change ratio for multiplication must naturally also take place for time difference measurement, which is performed by the frequency multipliers 12 and 14 for the input sampling rate on the one hand and the output sampling rate on the other.

Figure 12A:
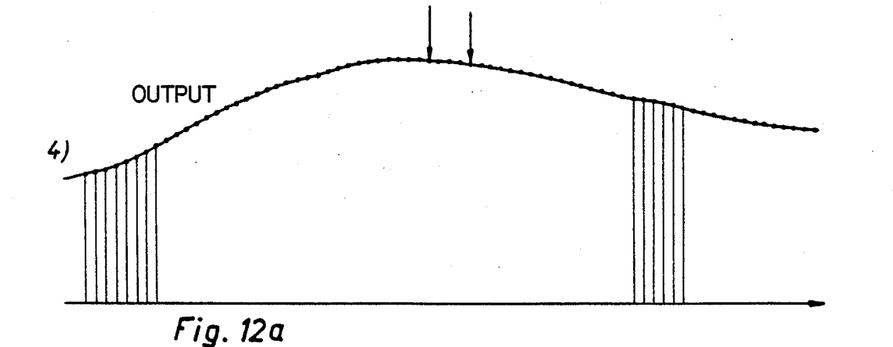

In the diagrams of FIGS. 12 and 12a are shown an example wherein the sampling frequency rates are increased with a cross filter. The sampling rate increase is 16 and the sampling rate conversion is fc=1/T. Output values are calculated at two different time points identified as iT and jT in the T raster field.

The input signal in the raster is 16×T. Zero sampling values are inserted in order to bring the sampling rate artificially to fc. The transverse filter times are iT.

In (1), the input signal raster is 16×T. Zero value sampling points are inserted in order to bring the sampling rate artificially to fc. In (2), the cross filter (transverse filter) time is iT. In (3), in the same filter, the time is jT. The filter has been displaced relative to the non-zero sampling points. The non-zero sampling values correspond to filter coefficients other than at the time points iT. In (4) is shown the output signal in the scanning field T at test frequency fc=1/T.

Figure 13:
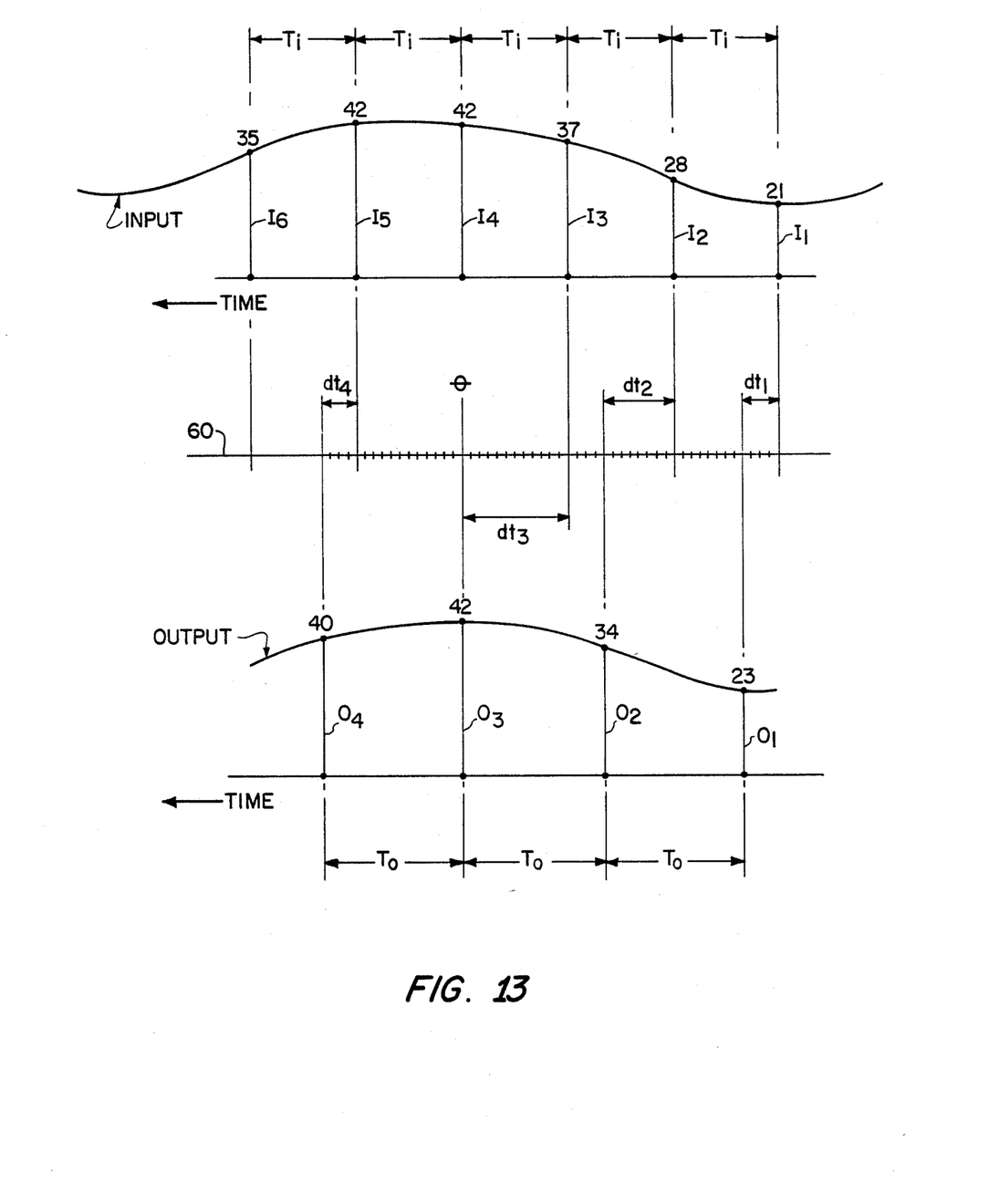
FIGS. 13 and 14 are curves and diagrams useful in aiding understanding of some of the concepts used in the invention.
Figure 14:
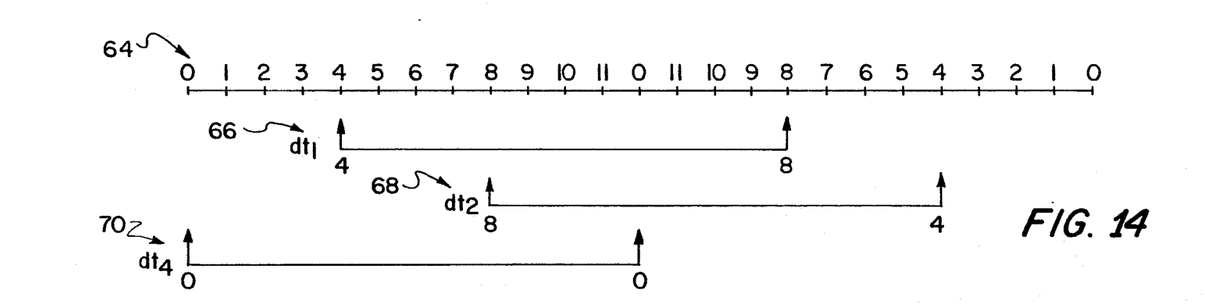

FIGS. 13 and 14, show, at a conceptual level, the manner in which the difference in times of the input and output signals, frequency and period, are used to generate filter coefficients which in turn are used to adjust the amplitudes of the input and output curve so that they will match each other.

Referring now to FIG. 13, the input curve in the upper part of the drawing is to be reproduced at the output exactly, but on a different frequency of sampling rates. In this particular example, the frequency of the input curve is higher than that of the output curve, and the period $T_i$ is correspondingly smaller than the period $T_0$. Six points $I_1$ to $I_6$ have been identified on the upper part of the drawing, and these are more or less overlapped for output points $0_1$ to $0_4$ on the output curve. The line 60 in the center portion of FIG. 13 is a kind of working area and the small marks thereon indicate the least count or the translation rate to be used in translating the input frequency to the output frequency. The drawing shows that this translation rate is considerably higher than either of the input or output frequencies to thus operate in a manner described below using predetermine filter coefficients.

The points marked along the tops of the input and output curves are amplitudes.

Assuming the sampling frequencies of the input and outputs are different, which is the case in FIG. 13, then it will be that each input sampling point will fall between two output sampling points, except when two points happen to coincide. This is the case with $I_4$ and $0_3$. Thus, the amplitudes of the curves are identical at that common point. At all other points, there is a difference in time, $dt_1$ being the difference between $I_1$ and $0_1$, $dt_2$ being the difference between $I_2$ and $0_2$, and so on as indicated.

In a case simpler than that shown in FIG. 13 where the ratio of the sampling frequencies at the input and output is an integer, then the time difference dt will be a constant. In such case, the interpolation can be performed even more quickly than as explained below using a constant corresponding to the integer.

FIG. 13 shows the case where the ratio is not an integer, and dt varies throughout the transmitted signal. In this particular example, the period $T_i$ of the input signal is smaller that the period $T_0$ of the output signal. Consequently, the various time differences $dt_1$ $dt_2$, etc. can have different values. The translation of the curve from the input to the output depends upon an interpolation based on these time differences as set forth below.

The manner in which this is done can be easily understood from the following highly simplified example. Numerical values have been assigned in order to further simplify the understanding.

The least count on the line 60, and all other values set forth below, have been arbitrarily selected as equaling 12 units for $T_i$ and 16 units for $T_0$. The first $dt_1$ is equal to 4 units on the line 60. $I_1$ has an amplitude of 21, and $I_2$ of 28. In order to determine the amplitude of $0_1$ it is necessary to interpolate between the value of $I_2$ which is 28, and the value of $I_1$, which is 21, to the point in time at which $0_1$ is located. That is, the amplitude of the curve at the point $0_1$ has to be interpolated from the known amplitudes at $I_1$ and $I_2$.

Block 1 determines that $dt_1$ in this example is equal to 4. Referring to line 64 on the top of FIG. 14, and to line 66 which represents $dt_1$, in effect, the line 66, which can be thought of as a kind of moving bridge, is first set at 4 to one side of the null point under line 64. The other end automatically generates the value of 8. The significance of this "moving bridge" is thus seen to be that $0_1$ is 4 units from $I_1$ and 8 units from $I_2$ along the line 60.

The interpolation is then easy. The amplitude at $I_1$ (21) is subtracted from the amplitude at $I_2$ (28) yielding 7. The ratio is 4/12 to get the value of the amplitude at $0_1$. By multiplying this by the 7 and then adding it to $I_1$ (21), since we are dealing with an increase in curve in this region, produces a value of 23 which is the amplitude at $0_1$.

In a similar manner to determine the amplitude at $0_2$, 28 is subtracted from 37 yielding 9, 8/12 is taken of this, using line 68 in FIG. 14, and the 8/12 of 9 (6) is then added to the 28 to produce a value of 34 for $0_2$.

No calculation is required for $0_3$, this is a coincident point, and thus the 42 is simply transferred from the input curve to the output curve at that coincident point in time.

Finally, line 70 produces the interpolated value for $dt_4$ to produce a value of 40 for $0_4$ based on $I_5$ and $I_6$.

The above examples show how the block 2 in FIG. 2 generates coefficients using the stored coefficients represented by line 64 for linear interpolations. The invention is also capable of quadratic interpolation, in such case three neighboring input samples $I_1$, $I_2$ and $I_3$, on a rolling basis will be used. That is, after the first such interpolation then $I_2$, $I_3$ and $I_4$ will be used, and so on.

The least count (12) on line 60 is, of course, only an example, a much finer matrix or division will be used in actual operation of the invention.

The manner of operation explained above can be carried out quite quickly in logic block 3 of FIG. 1, using known interpolation means which involve a division.

It is also possible to use the respective values directly to ascertain the values of the amplitudes of the output curve. However, the computation for such an operation would consume a great deal of time, so that such a converter could work at only relatively low speed. The invention's use of prepared coefficients as represented by the line 64 and the simple system set forth above by way of example, permits the use of known electronic circuitry to operate very quickly so that the work can be done at relatively much higher speeds. This is a material advantage for the present invention over the prior art.

Figure 15:
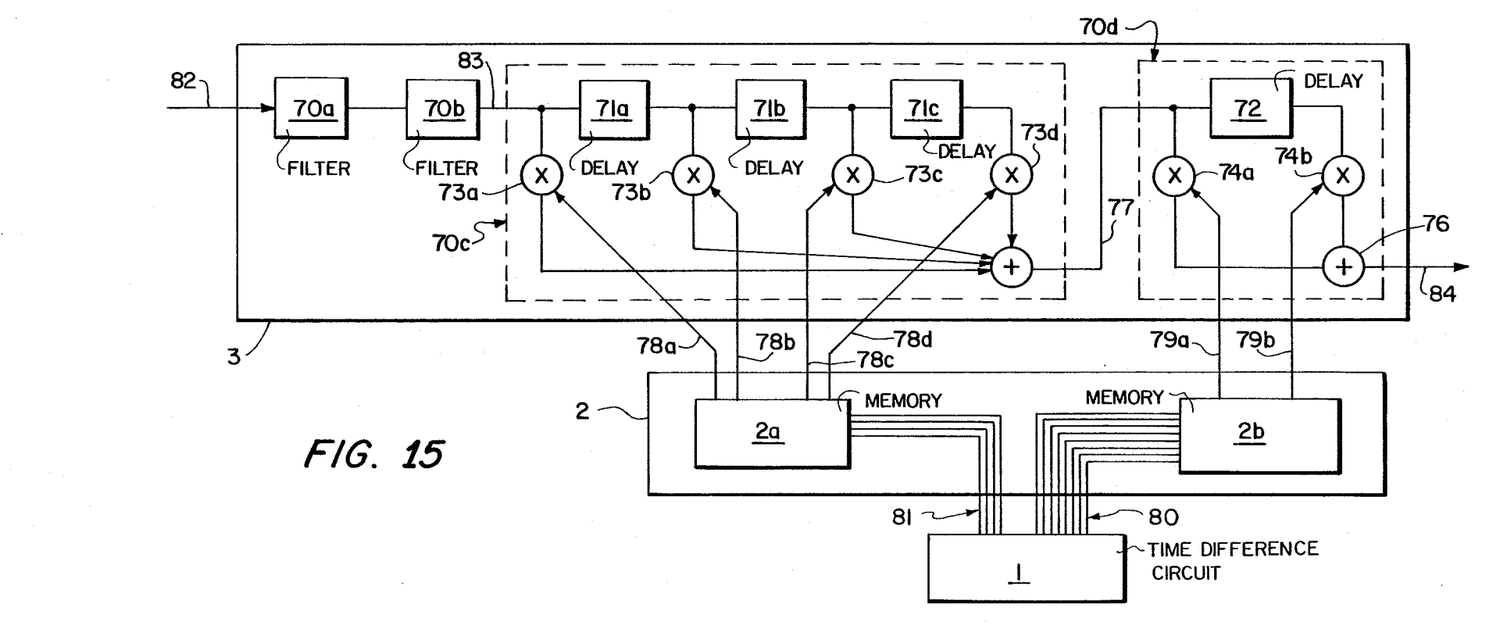
FIG. 15 is a more detailed schematic circuit block diagram of the circuit of FIG. 1.

FIG. 15 shows a simplified electronic block diagram of circuit means to carry out the above process, that is, to perform the function of the blocks 2 and 3 in FIG. 1 of translating the time differences into filter coefficients and of interpolating between two or more input sampling values.

Referring now in detail to FIG. 15, there is shown the sampling rate time difference circuit 1, the translation circuit 2 and the sampling filter 3, which is composed of four filters 70a, 70b, 70c and 70d. The translation circuit 2 is composed of two memories 2a, and 2b, both implemented with well known ROM's. The two filters 70a and 70b are designed to operate with fixed coefficients, while the filters 70c and 70d operate with coefficients stored in an transmitted from the translation circuit 2. The filters 70c and 70d, which for this example are supposed to be transverse filters, are therefore composed of delay circuits 71a, 71b, 71c and 72 respectively as well as multipliers 73a, 73b, 73c, 73d; and 74a and 74b respectively. Each filter 70c and 70d are connected together by a line 77. Lines 78a, 78b, 78c and 78d connect the memory 2a to the multipliers 73a, 73b, 73c and 73d of the filter 70c respectively. Lines 79a and 79b connect the memory 2b to the multipliers 74a and 74b of the filter 70d.

As the circuit 1 outputs time difference values of 12-bit wordlength for this example, eight lines 80 connect the memory 2b with the circuit 1 and four lines 81 connect the memory 2a to the circuit 1. Filter 70c is capable of performing a cubic (operator on four samples) interpolation while filter 70d is designed to perform a linear interpolation. Filters 70a and 70b are designed to increase the input sampling frequency by a fixed ratio, but all components shown in this FIG. 15 are state of the art, as mentioned earlier.

The operation of the circuit of FIG. 15 will now be described. The output sampling frequency and the output sampling times are given, even if they are varying. At each input sampling time, the time difference measuring circuit 1 is started and then stopped at the succeeding output sampling time. The circuit 1 releases time difference values dt, $dt_2$, etc. as shown in FIG. 13. Those time differences are measured by pulses, e.g., pulses of the translation sampling rate as schematically represented as units on line 60 of FIG. 13. A value corresponding to the number of pulses measured during each of those time differences $dt_1$, $dt_2$, etc., is transmitted to the translation circuit 2. Those values act as memory addresses and therefore designate coefficients which are directed to the multipliers 73 and 74.

Each input sampling value $I_1$, $I_2$, $I_3$, etc., as shown in FIG. 13 is input through line 82 and directed to the filter 70a. There the sampling rate is increased by a factor of two. The samples are then directed to the filter 70b where the sampling rate is increased again by a factor of four, as an example. In the filter 70c a first output sample is produced by interpolation over four samples and based on the time difference measured between the given output sampling time and the input sampling time of the sample introduced through line 82. This output sample is then transmitted through line 77 to the filter 70d where the required output sample is interpolated between two output samples from the filter 70c also based on the time difference measured. The time differences $dt_1$, $dt_2$, $dt_3$, etc. released by the circuit 1 are formatted, for example, into a 12-bit number. Of this number, the four most significant bits are transmitted through lines 81 to the memory 2a where this 4-bit number is used as a memory address to read out a set of four coefficients to be transmitted through lines 78a to 78d to the multipliers 73 of the filter 70c. The eight least significant bits of this number are transmitted through the eight lines 80 to the memory 2b where this 8-bit number is used as a memory address to read out a set of two coefficients to be transmitted through lines 79a and 79b to the multipliers 74a and 74b.

The operations of the filters 70c and 70d are very similar and therefore the operation of the filter 70d only is described. Assume that an output sample $O_1$ according to FIG. 13 is to be produced. The circuit 1 started at the time the input sample $I_1$ was detected and consecutively stopped when the output sampling time $O_1$ is detected by the circuit 1. Within this time, this input sampling value $I_1$ may have traversed the filters 70a and 70b and appeared on line 83 as an input to filter 70c. By then, this input sampling value $I_1$ may have changed slightly to $I_1'$. The treatment in filter 70c may further change this value to $I_1''$, and the time at which it appears on line 77 will have changed relative to the input sampling time thereof due to interpolation in the filter 70c. This value $I_1''$ is then stored in the delay circuit 72. During this time, the same procedure happens to the input sampling value $I_2$ which appears as $I_2''$ on line 77. Then $I_2''$ is transmitted to the multiplier 74a and $I_1''$ is transmitted to the multiplier 74b. There they are each multiplied by a coefficient transmitted through lines 79a and 79b. The results are then added in the adder 76 and the output sampling value $O_1$ is released from the filter 70d through line 84. The two coefficients used for linear interpolation equal unity when they are added together.

In the case of the presented example of a four-stage interpolation, the filter 3 interpolation as previously described between input values $I_1$ and $I_2$ is executed between already interpolated values $I_1''$ and $I_2''$. The cubic interpolation between $I_1'$ and $I_2'$ is based strictly on the same principle of operation of the delay circuits 71, the multipliers 73, the adder 75 and the memory 2a. If a modest quality of the output signal is acceptable, the sampling filter 3 may be designed as a one stage filter only. The sampling filter 3 then would consist of the filter 70d only. Linear interpolation would take place between two input sampling values $I_1$ and $I_2$ directly as described above.

If the output sampling frequency is varying or suddenly selected differently, the filter 3 and the translating circuit 2 automatically adjust for the new situation. The change in output sampling frequency translates into a change of the time differences $dt_1$, $dt_2$, etc., measured by the circuit 1. This causes other but already stored coefficients to be output according to the new time difference only. Therefore, the sampling filter 3 adjusts to any new or rapidly changing output sampling frequency.

While the invention has been described in detail above, it is to be understood that this detailed description is by way of example only, and the protection granted is to be limited only within the spirit of the invention and the scope of the following claims.

What is claimed is:

1. An apparatus for translating an input sampling sequence with an input sampling rate into an output sampling sequence with a selectable output sampling rate, comprising:
  first circuit means for determining an instantaneous time difference between input and output sampling times and for producing signals representative of that difference;
  translation circuit means for converting said signals representative of time difference into data representative of a set of filter coefficients; and
  sampling filter circuit means for converting the input sampling sequence at the input sampling rate into the output sampling sequence at the output sampling rate in response to said filter coefficients
  said first circuit means comprising an oscillator phase-coupled with and responsive to the input sampling rate and having a frequency which is an integral multiple of the input sampling rate and a counting circuit responsive to the oscillator and the output sampling rate and the input sampling rate for determining time intervals between the sampling times of the output sampling sequence and sampling times of the input sampling sequence by an integral number of time intervals of an oscillator output signal.

2. An apparatus according to claim 1, wherein said translation circuit means comprises means for multiplying the signals representative of the time difference by a fixed value for producing an output timing signal representative of a subset of said filter coefficients.

3. An apparatus according to claim 1, and including second circuit means for time-averaging the instantaneous time difference, said second circuit means being connected between said first circuit means for determining the time difference and said translation circuit means.

4. An apparatus according to claim 1 wherein the sampling filter circuit means comprises a cascade of at least two single-stage partial filters outputting increased translation sampling rates, and a circuit operatively coupled to the cascade for subsampling a sequence with a highest sampling rate fed in by the cascade for producing the output sampling sequence.

5. An apparatus according to claim 1 wherein the sampling filter circuit means comprises a series connection of a circuit for inserting zero sampling values and of a cascade of a plurality of n partial filters with stepwise decreasing translation sampling rates, the number n of partial filters being equal to or greater than 2.

6. An apparatus according to claim 4 or 5, further comprising comparison circuit means, coupled to the sampling filter circuit means.

7. An apparatus according to claim 1, wherein a postfilter, connected downstream of the sampling filter circuit means, reduces the output sampling rate by a fixed ratio; and a frequency multiplication circuit for the output sampling rate is connected upstream of an input of the first circuit means and increases the output sampling rate by an identical ratio.

8. An apparatus according to claim 1 wherein the sampling filter circuit means comprises a cascade of a plurality of single-stage partial filters, including at least two identical single-stage subfilters, which all have identical and equivalent coefficients.

* * * * *